US012620801B2

(12) United States Patent
Li et al.

(10) Patent No.: US 12,620,801 B2
(45) Date of Patent: May 5, 2026

(54) LEAKAGE CURRENT DETECTION AND INTERRUPTION DEVICE AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 172 days.

(21) Appl. No.: 18/432,475

(22) Filed: Feb. 5, 2024

(65) Prior Publication Data

US 2025/0253647 A1 Aug. 7, 2025

(30) Foreign Application Priority Data

Feb. 2, 2024 (CN) .......................... 202420256867.2

(51) Int. Cl.
| | |
|---|---|
| *H02H 9/02* | (2006.01) |
| *G01R 31/28* | (2006.01) |
| *G01R 31/52* | (2020.01) |
| *H02H 3/02* | (2006.01) |
| *H02H 7/00* | (2006.01) |

(52) U.S. Cl.
CPC ........... *H02H 9/02* (2013.01); *G01R 31/2827* (2013.01); *G01R 31/2829* (2013.01); *G01R 31/52* (2020.01); *H02H 3/025* (2013.01); *H02H 7/008* (2013.01)

(58) Field of Classification Search
CPC .......... H02H 9/02; H02H 3/025; H02H 7/008; G01R 31/2827; G01R 31/2829; G01R 31/52
See application file for complete search history.

(56) References Cited

U.S. PATENT DOCUMENTS

| | | | |
|---|---|---|---|
| 11,444,448 B2 * | 9/2022 | Li | ........................... H02H 3/335 |
| 2021/0118869 A1 * | 4/2021 | Li | ........................... G01R 31/50 |

* cited by examiner

*Primary Examiner* — Crystal L Hammond
*Assistant Examiner* — Samantha L Faubert
(74) *Attorney, Agent, or Firm* — Chen Yoshimura LLP

(57) ABSTRACT

A leakage detection and interruption device includes a switch module to control power connection between input and output terminals of a power line; a leakage detection module to generates a leakage fault signal when the leakage current on the power line exceeds a threshold; a power module, including a first current limiting element, coupled in series between the power line and the leakage detection module, to supply power to the leakage detection module; the driving module includes a electromagnetic coil and a switching semiconductor device, to drive the switching module to disconnect the power connection in response to a leakage fault signal. The first end of the first current limiting element is coupled to the power line, and the second end is coupled to the first end of the switching semiconductor device through at least one first diode and/or second current limiting element.

12 Claims, 6 Drawing Sheets

LEAKAGE CURRENT DETECTION AND INTERRUPTION DEVICE AND RELATED ELECTRICAL CONNECTORS AND ELECTRICAL APPLIANCES

BACKGROUND OF THE INVENTION

This invention relates to electrical circuits, and in particular, it relates to a leakage current detection and interruption device, and related electrical connectors and electrical appliances.

With increased consumer awareness of environmental and safety issues, there are increased demands for lower power consumption of household appliances in standby or off states (e.g., below 0.5 watts, etc.). Because many household appliances are equipped with leakage current detection and interruption devices (e.g., power plug with leakage current detection and interruption devices), this presents a challenge for reducing power consumption of the appliances. Conventional leakage current detection and interruption devices on the market have relatively high power consumption, and tend to have a single detection function, making it difficult to meet environmental conservation requirements.

SUMMARY OF THE INVENTION

To solve the above problems, embodiments of the present invention provides a leakage current detection and interruption device which employs a current limiting element to effectively reduce power consumption, and provides multiple detection capabilities to meet enhanced environmental requirements in energy consumption and to satisfy users' needs.

In a first aspect, the present invention provides a leakage current detection and interruption device, which includes: a switch module, configured to control a power connection between the input and output ends of a power line; a leakage detection module configured to detect a leakage current on the power line and to generate a leakage fault signal when the leakage current exceeds a predefined threshold; a power module, configured to supply power to a power input end of the leakage detection module, the power module including at least one first current limiting element coupled in series between the power line and the leakage detection module; and a driving module, configured to drive the switching module to disconnect the power connection in response to the leakage fault signal, the driving module including at least one first electromagnetic coil and at least one first switching semiconductor device, and wherein a first end of the first electromagnetic coil is coupled to the power line, a second end of the first electromagnetic coil is coupled to a first end of the first switching semiconductor device, a first end of the first current limiting element is coupled to the power line, and a second end of the first current limiting element is coupled to the first end of the first switching semiconductor device via at least one first diode and/or second current limiting element.

In some embodiments, the device further includes: a self-test module, coupled to the leakage detection module and the driving module, configured to generate a self-test signal and to generate a self-test fault signal when the leakage detection module and/or the driving module has a fault.

In some embodiments, when the leakage detection module has a fault and the driving module is normal, the self-test module generates a self-test processing signal; and wherein the driving module drives the switching module to disconnect the power connection in response to the self-test processing signal.

In some embodiments, when the input end of the power line is powered off, the switch module maintains its original connected state.

In some embodiments, the first current limiting element includes a resistor, a capacitor, or an inductor, or a combination thereof.

In some embodiments, the first diode is integrated into the power module.

The leakage current detection and interruption device in the above embodiments can effectively reduce the power consumption of the device. Moreover, it has the ability to detect both leakage current having AC characteristics and leakage current having pulsating DC characteristics.

In a second aspect, the present invention provides a leakage current detection and interruption device, which includes: a switch module, configured to control a power connection between the input and output ends of a power line; a leakage detection module configured to detect a leakage current on the power line and to generate a leakage fault signal when the leakage current exceeds a predefined threshold; a power module, configured to supply power to a power input end of the leakage detection module, the power module including at least one first capacitor coupled in series between the power line and the leakage detection module; a driving module, configured to drive the switching module to disconnect the power connection in response to the leakage fault signal, the driving module including at least one first electromagnetic coil and at least one first switching semiconductor device; and a self-test module, coupled to the leakage detection module and the driving module, configured to generate a self-test signal and to generate a self-test fault signal when the leakage detection module and/or the driving module has a fault.

In some embodiments, the leakage detection module has a fault and the driving module is normal, the self-test module generates a self-test processing signal; and wherein the driving module drives the switching module to disconnect the power connection in response to the self-test processing signal.

In some embodiments, when the input end of the power line is powered off, the switch module maintains its original connected state.

The leakage current detection and interruption device in the above embodiments of the second aspect can effectively reduce the power consumption of the device, and has a periodic self-test function, enabling the user to timely discover faults in the leakage detection module and/or the driving module.

In a third aspect, the present invention provides an electrical power connection device, which includes: a body; and a leakage current detection and interruption device of any of the above embodiments, disposed inside the body.

In a fourth aspect, the present invention provides an electrical appliance, which includes: an electrical load; and an electrical power connection device coupled between a power supply and the electrical load, configured to supply power to the electrical load, wherein the electrical power connection device includes a leakage current detection and interruption device according to any of the above embodiments.

BRIEF DESCRIPTION OF DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks represent electrical or magnetic coupling of the blocks; the absence of lines between blocks does not mean the lack of coupling.

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

In this disclosure, a transistor may be of any type and structure, such as field-effect transistor (FET) including metal-oxide-semiconductor field-effect transistor (MOS-FET), bipolar junction transistor (BJT), silicon controlled rectifier (SCR), etc. When the transistor is a FET, the control electrode refers to the gate of the FET, the first electrode may be the drain or source of the FET, and the corresponding second electrode may be the source or drain of the FET. When the transistor is a BJT, the control electrode refers to the base of the BJT, the first electrode may be the collector or emitter of the BJT, and the corresponding second electrode may be the emitter or collector of the BJT. When the transistor is an SCR, the control electrode refers to the control electrode G of the SCR, the first electrode may be the anode, and the corresponding second electrode may be the cathode. A switching semiconductor device may include a transistor or other devices with similar functions.

Embodiments of the present invention provide a leakage current detection and interruption device that can meet enhanced environmental requirements in energy consumption and provide multiple detection capabilities to satisfy users' needs.

Figure 1:
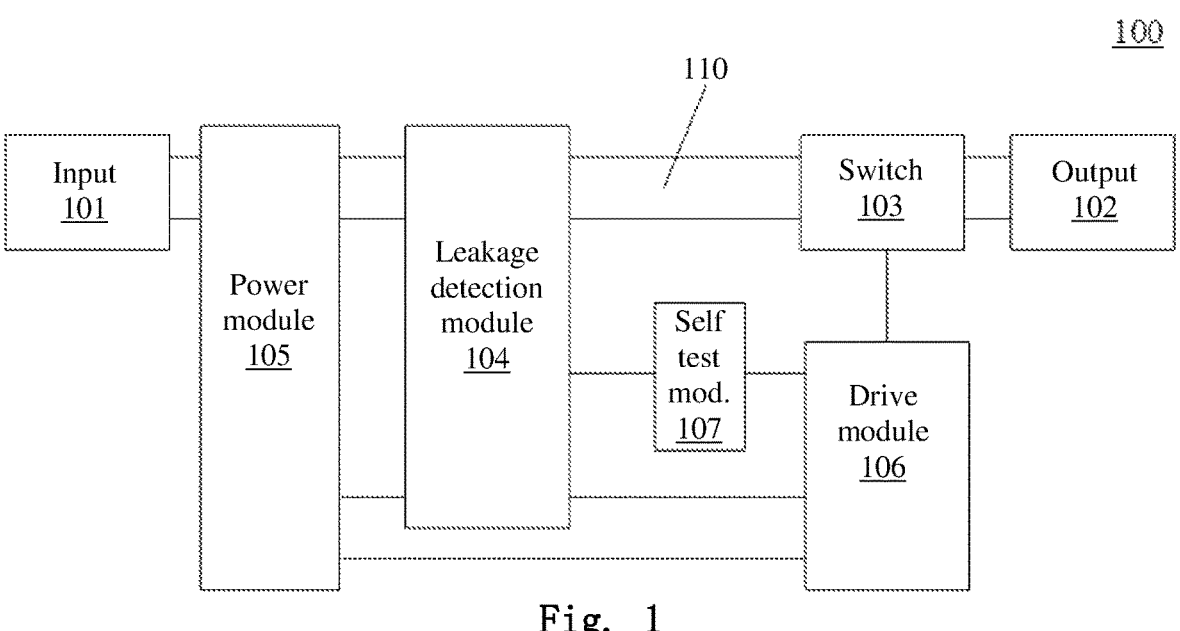
FIG. 1 is a block diagram illustrating a leakage current detection and interruption device according to some embodiments of the present invention.

FIG. 1 is a block diagram illustrating a leakage current detection and interruption device 100 according to some embodiments of the present invention.

As shown in FIG. 1, the leakage current detection and interruption device 100 includes power line 110 having input end 101 and output end 102, a switch module 103, the leakage detection module 104, a power module 105, and a driving module 106. The switch module 103 is coupled between the input terminal 101 and the output terminal 102 to control the power connection therebetween. The power line (also referred to as current-carrying lines or power supply lines) connect the input terminal 101 and the output terminal 102, and includes, for example, a first current-carrying line L (HOT) for connecting to of the hot line of the power grid and a second current-carrying line N (WHITE) for connecting to the neutral line of the power grid. The output terminal 102 is coupled to a load (LOAD), such as an electrical appliance or a power strip. When the load uses power, a current loop is formed between the first current-carrying line and the second current-carrying line. The leakage detection module 104 is coupled between the input terminal 101 and the output terminal 102, and is configured to detect whether there is a leakage current on the power line, and to generate a leakage fault signal when a leakage current is detected. The driving module 106 is coupled to the leakage detection module 104 and the switch module 103, and drives the switch module 103 to disconnect the power connection between the input terminal 101 and the output terminal 102 in response to the leakage fault signal from the leakage detection module 104. When the input end 101 of the power line 110 is powered off, the switch module 103 maintains the original connected state. The power module 105 is coupled to the power line 110 and the leakage detection module 104, and supplies power to the power supply end of the leakage detection module 104. The power module 105 includes at least a current limiting element, which is coupled in series between the power line 110 and the leakage detection module 104 to reduce the overall operating power consumption of the device 100. The power module 105 also feeds a signal to the driving module 106 to control the driving module 106 to drive the switch module 103 in a partial cycle or a full cycle, so that it can detect detection both leakage current having AC (alternating current) characteristics and leakage current having pulsating DC (direct current) characteristics.

The leakage current detection and interruption device 100 may also include a self-test module 107, which is coupled to the leakage detection module 104 and the driving module 106. The self-test module 107 is configured to generate a self-test signal (for example, simulating the occurrence of leakage current), and to generate a self-test fault signal when the leakage detection module 104 and/or the driving module 106 has a fault, so that faults in the leakage current detection and interruption device 100 can be timely discovered and the device can be replaced.

Compared with existing leakage current detection and interruption devices (for example, power consumption is generally around 0.3 w), the leakage current detection and interruption device 100 according to the embodiment of FIG. 1 can effectively reduce operating power consumption (for example, with ultra-low power consumption less than or equal to 0.1 w), which meets environmental conservation requirements, and also has capabilities of detecting leakage current having AC characteristics and leakage current having pulsating DC characteristics. In addition, the leakage current detection and interruption device 100 can also achieve ultra-low power consumption while providing a self-checking function.

Various exemplary circuits of the leakage current detection and interruption device 100 are described below with reference to FIGS. 3-5.

Figure 3:
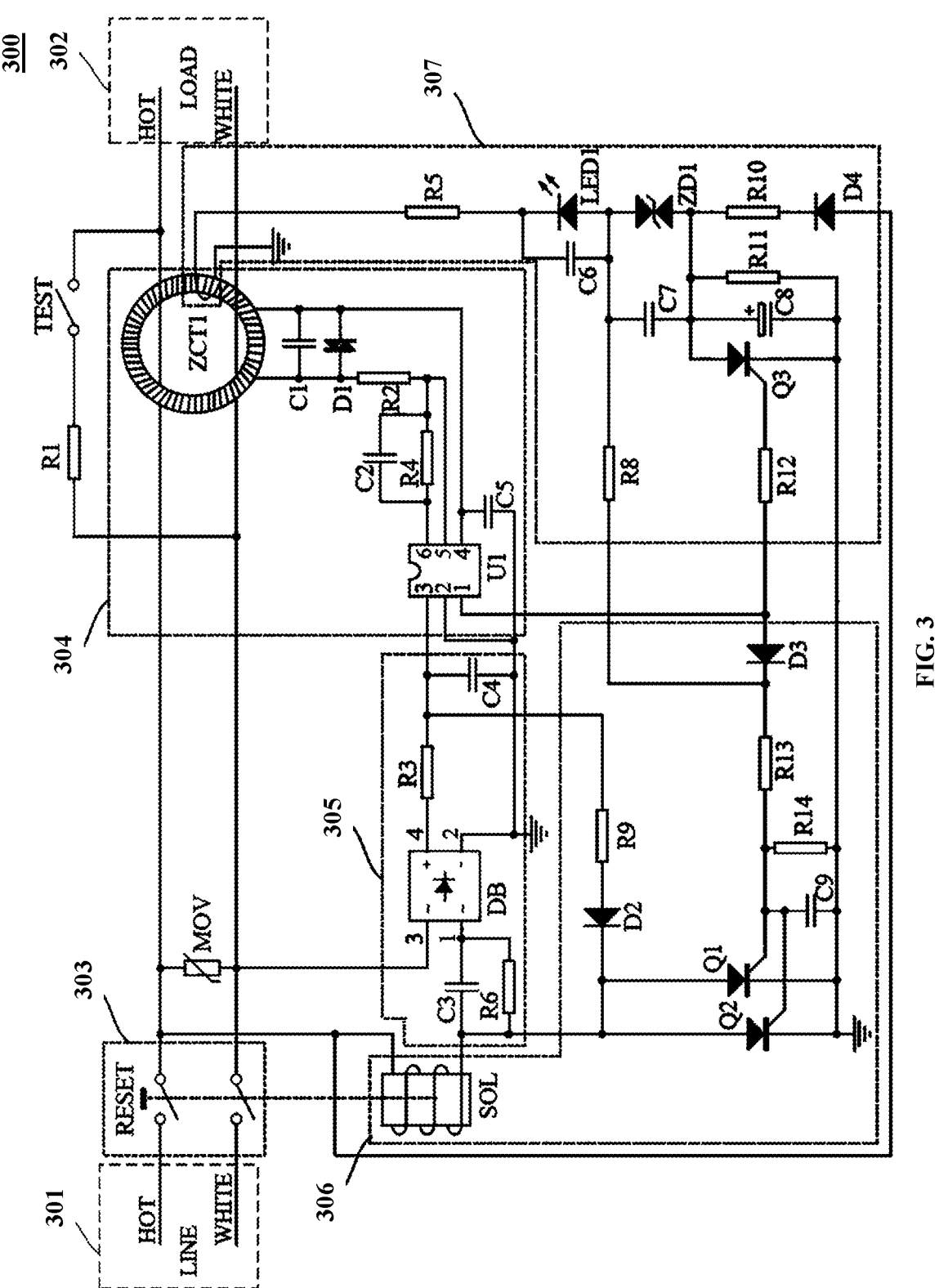
FIG. 3 is a circuit diagram of a leakage current detection and interruption device according to a first embodiment of the present invention based on the block diagram of FIG. 1.

FIG. 3 shows a first exemplary circuit 300 of the leakage current detection and interruption device 100 of FIG. 1 according to the present invention. The circuit 300 includes a switch module 303, a leakage detection module 304, a power module 305, and a driving module 306. These modules may correspond to corresponding modules of the device 100 of FIG. 1.

As shown in FIG. 3, the power line includes a first current-carrying line HOT and a second current-carrying line WHITE. The switch module 303 includes a reset switch RESET disposed between the input terminal 301 and the output terminal 302. When the circuit 300 is operating normally, the switch module 303 remains closed.

The leakage detection module 304 includes a leakage detection ring ZCT1, a leakage detection chip or processor U1, and resistors, capacitors, etc. used in combination with the above components. The leakage detection ring ZCT1 has the first current-carrying line HOT and the second current-carrying line WHITE passing therethrough to detect whether there is a leakage current in the first current-carrying line HOT and the second current-carrying line WHITE. It collects the above-mentioned leakage current and sends it to the leakage detection chip U1, where the leakage detection chip U1 compares the leakage current with a predefined threshold, and generates a leakage current fault signal (for example, via pin 1 of the leakage detection chip U1) when the leakage current exceeds the predefined threshold.

The power module 305 includes a full-wave rectifier DB, a capacitor C3, and resistors, capacitors, etc. used in combination with the above components. The capacitor C3 is coupled between the power line and the input of the rectifier DB (for example, pin 1), and the output of the rectifier DB (for example, pin 4) is coupled to the power supply end of the leakage detection module 304 (for example, pin 3 of the leakage detection chip U1) to supply power to the leakage detection module 304. Specifically, the first end of the capacitor C3 is coupled (for example, via the electromagnetic coil SOL) to the power line (for example, the first current-carrying line HOT), and the second end of the capacitor C3 is coupled to the input pin 1 of the rectifier DB. In FIG. 3, capacitor C3, as the first current-limiting component, does not do any work and does not generate active power consumption, thereby both limiting the current and reducing power consumption.

The driving module 306 includes a first electromagnetic coil SOL and at least one switching semiconductor device. In the embodiment of FIG. 3, the at least one switching semiconductor device is implemented as parallel-coupled switching semiconductor devices Q1 and Q2 (e.g., transistors) to provide redundant driving capabilities. In other embodiments, the at least one switching semiconductor device may be implemented as more or fewer transistors. The first end of the electromagnetic coil SOL is coupled to the power line (for example, the first current carrying line HOT), and the second end is coupled to the first end (or input end) of the at least one switching semiconductor devices Q1, Q2. The second ends (or output terminals) of the switching semiconductor devices Q1 and Q2 are coupled to ground. The electromagnetic coil SOL generates electromagnetic force for driving the reset switch RESET. The control terminals of the switching semiconductor devices Q1 and Q2 are respectively coupled to the leakage detection module 304 (for example, pin 1 of the leakage detection chip U1). The first end of the at least one switching semiconductor device Q1, Q2 may also be connected via at least one first diode (for example, the diode D2 in FIG. 3) and/or a second current limiting element (for example, the resistor R9 in FIG. 3) to the second end of the capacitor C3 which acts as the first current limiting element, so that the semiconductor devices Q1 and Q2 can continue to be in the On state when they are triggered to turn On.

As shown in FIG. 3, when the circuit 300 is operating normally, a current flows through the current path HOT-SOL-C3-DB-R3 to provide working power for the leakage detection module 304.

When leakage current occurs in the current-carrying lines HOT and WHITE, the leakage detection ring ZCT1 detects the leakage current signal and transmits the signal to the leakage detection chip U1. After processing and comparison by the chip U1, if the detected leakage current is greater than the predefined threshold, pin 1 of chip U1 outputs a high voltage level (leakage fault signal), otherwise it outputs a low voltage level. The high voltage level of pin 1 of the leakage detection chip U1 is provided to the control terminal of at least one switching semiconductor device Q1 and Q2 of the driving module 306 via the switching semiconductor device D3 and the resistor R13, triggering the switching semiconductor device Q1 and/or Q2 to conduct. This causes a current change on the electromagnetic coil SOL, thereby generating an electromagnetic force, driving the reset switch RESET to disconnect the power connection between the input terminal 301 and the output terminal 302 of the power line.

More specifically, if the detected leakage current is greater than the predefined threshold, the leakage fault signal output by pin 1 of the chip U1 triggers the switching semiconductor devices Q1 and/or Q2 to turn on, in which the current flows through the current path HOT-SOL-Q1/Q2-DB-WHITE in one half of the cycle, and the current flows through the current path WHITE-DB-R3-R9-D2-Q1/Q2-DB-C3-SOL-HOT in the other half of the cycle, so that the switching semiconductor device Q1/Q2 can continue to conduct until the magnetic field of the electromagnetic coil SOL drives the reset switch RESET to disconnect the power connection between the input terminal 301 and the output terminal 302 of the power line. Regardless of whether the power line HOT voltage is higher than the power line WHITE voltage or the power line HOT voltage is lower than the power line WHITE voltage, the circuit 300 has a tripping capability, so that it has leakage current detection capabilities for both current with pulsating DC characteristics and current with AC characteristics.

The circuit 300 also includes a self-test module 307. The self-test module 307 provides a self-test function to detect whether the functions of the leakage detection module 304 and the driving module 306 are normal.

As shown in FIG. 3, the self-test module 307 includes a switching semiconductor device Q3, a voltage regulator tube ZD1, a diode D4, a light emitting diode LED1, a capacitor C8, and resistors and capacitors used in combination with the above components. A current flows through the path HOT-D4-R10 to charge the capacitor C8. When the voltage at the upper end of the capacitor C8 exceeds the threshold voltage of the triggering regulator ZD1, the voltage-regulating tube ZD1 is triggered to conduct, and a current flows through the path C6-R5-ZCT1 to generate a simulated leakage current signal in the leakage detection loop ZCT1 as a self-test signal. When the leakage detection ring ZCT1 detects the simulated leakage current signal, it transmits the signal to the leakage detection chip U1. If the chip U1 works normally, after processing and comparison the signal by the chip U1, pin 1 of the chip U1 outputs a high voltage level (leakage fault signal). The high voltage level of pin 1 of the leakage detection chip U1 is provided to the control terminal of the switching semiconductor device Q3 via the resistor R12, triggering the switching semiconductor device Q3 to turn on and rapidly discharges the residual charge of the capacitor C8. This time period is short, so the voltage rise across the capacitor C9 is relatively low and will not cause the switching semiconductor device Q1/Q2 to turn on, i.e., it will not cause the solenoid SOL to drive the reset switch RESET to disconnect the power connection between the input terminal 301 and the output terminal 302 of the power line. Moreover, since the voltage regulator tube ZD1 does not remain conductive for a long time, the light-emitting diode LED1 will not emit light.

When the leakage detection module 304 is not functioning normally, pin 1 of the leakage detection chip U1 does not output a high voltage level (leakage fault signal), so the switching semiconductor device Q3 does not conduct. As a result, the capacitor C8 will not be rapidly discharged, and the voltage regulator tube ZD1 remains conductive for a long time period. After the capacitor C6 is fully charged, a current flows through the light-emitting diode LED1, which will light up the light-emitting diode LED1 (for example, flashing) which acts as a self-test fault signal. At the same time, the current is provided to the capacitor C9 via the resistor R8 as a self-test processing signal. Based on the self-test processing signal, the driving module 306 causes the voltage across the capacitor C9 to rise sufficiently to trigger the switching semiconductor device Q1/Q2 to turn on, so that the electromagnetic coil SOL is energized to generate a strong magnetic field. The magnetic field drives the switch module RESET to disconnect the power connection between the input terminal 301 and the output terminal 302 of the power cord, so as to remind the user that the leakage detection module 304 is faulty and needs to be replaced timely. That is, when the leakage detection module 304 has a fault but the driving module 306 is normal, the turning on of the light-emitting diode LED1 and the tripping operation can be regarded as a self-test fault signal. In other examples, audible indications or other indications may also be used as self-test fault signals. Similarly, when the driving module 306 has a fault (for example, the electromagnetic coil SOL fails to trip the reset switch RESET), the turning on of the light-emitting diode LED1 and the failure to trip can be regarded as a self-test fault signal.

Figure 4:
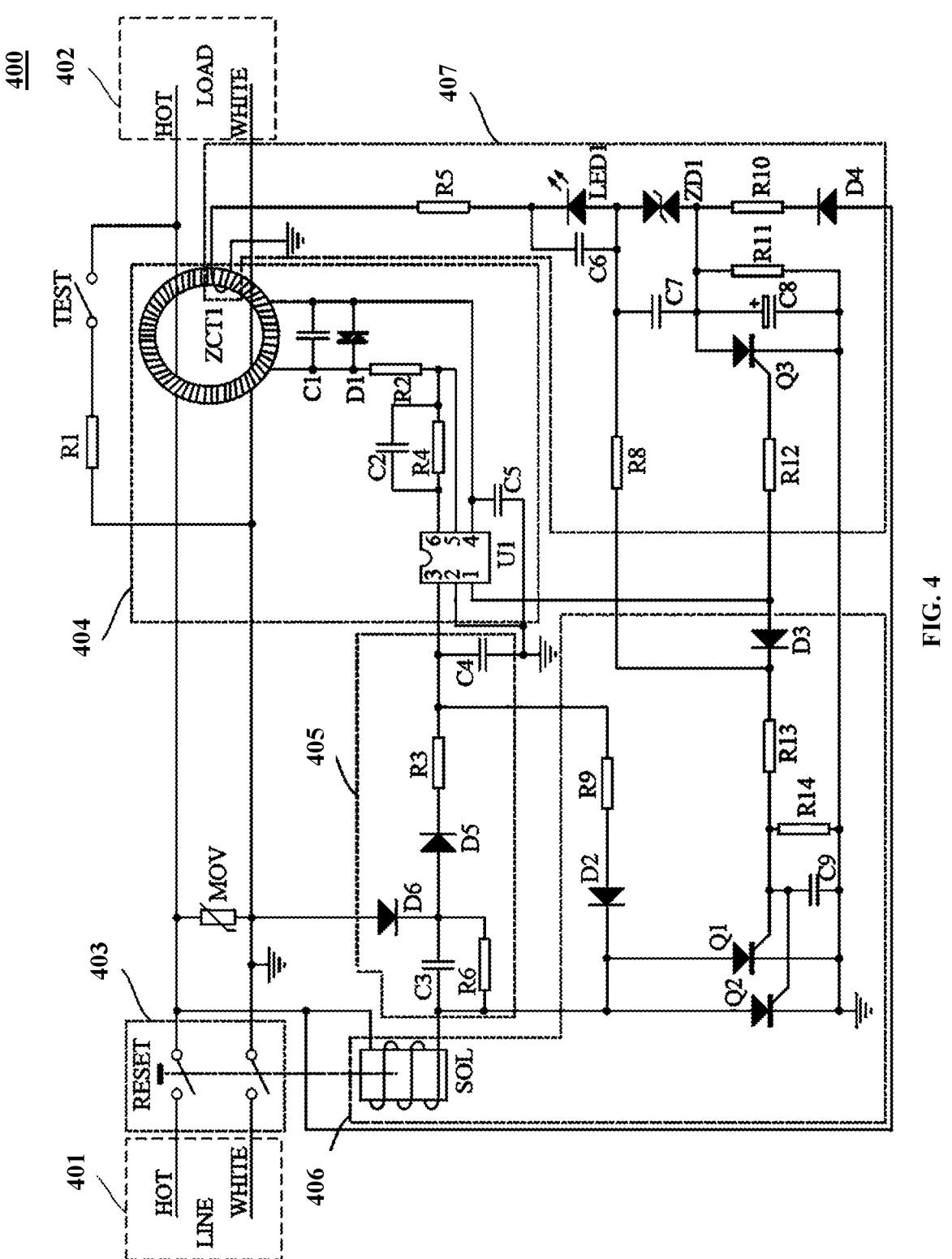
FIG. 4 is a circuit diagram of a leakage current detection and interruption device according to a second embodiment of the present invention based on the block diagram of FIG. 1.

FIG. 4 shows a second exemplary circuit 400 of the leakage current detection and interruption device 100 of FIG. 1 according to the present invention. The circuit 400 includes a switch module 403, a leakage detection module 404, a power supply module 405, and a driving module 406. These modules may correspond to corresponding modules of the device 100 of FIG. 1. In addition, the circuit 400 also includes an input terminal 401 and an output terminal 402 of the power line, and a self-test module 407.

Except for the power module 405, the other modules of the circuit 400 have the same or similar circuits and functions as the corresponding modules of the circuit 300, and their working principles will not be described in detail. In the circuit 400, the power module 405 includes a half-wave rectifier bridge including diodes D5 and D6, a capacitor C3, and resistors, capacitors, etc. used in combination with the above components. Capacitor C3 is coupled between the power line and the input of the half-wave rectifier bridge (for example, between diodes D5 and D6), and the output of the half-wave rectifier bridge (for example, the cathode of diode D5) is coupled to the power supply end of the leakage detection module 404 (for example, pin 3 of the leakage detection chip U1) to supply power to the leakage detection module 404. Specifically, a first end of the capacitor C3 is coupled (e.g., via the electromagnetic coil SOL) to the power line (e.g., the first current-carrying line HOT), and a second end of the capacitor C3 is coupled to the input of the half-wave rectifier bridge. In FIG. 4, the capacitor C3, as the first current-limiting component, does not do any work and therefore does not generate active power consumption, thereby both limiting current and reducing power consumption. Similar to FIG. 3, the first end of at least one switching semiconductor device Q1, Q2 may also be coupled, via at least one first diode (for example, diode D2 in FIG. 3) and/or a second current limiting element (for example, resistor R9 in FIG. 3), to the second end of the capacitor C3 which acts as the first current limiting element.

Similar to FIG. 3, when the leakage detection chip U1 detects the leakage current and outputs a high voltage level (the leakage fault signal), triggering the switch semiconductor device Q1 and/or Q2 to turn on, the current flows through the path HOT-SOL-Q1/Q2-WHITE in one half of the cycle, and flows through the path C4 (discharging current)-R9-D2-Q1/Q2-WHITE in the other half of the cycle, so that the switching semiconductor device Q1/Q2 can continues to be in the On state until the magnetic field of the electromagnetic coil SOL drives the reset switch RESET to disconnect the power connection between the input terminal 401 and the output terminal 402 of the power line. Regardless of whether the power line HOT voltage is higher than the power line WHITE voltage or the power line HOT voltage is lower than the power line WHITE voltage, the circuit 400 has a tripping capability, so that it has leakage current detection capabilities for both current with pulsating DC characteristics and current with AC characteristics.

Figure 5:
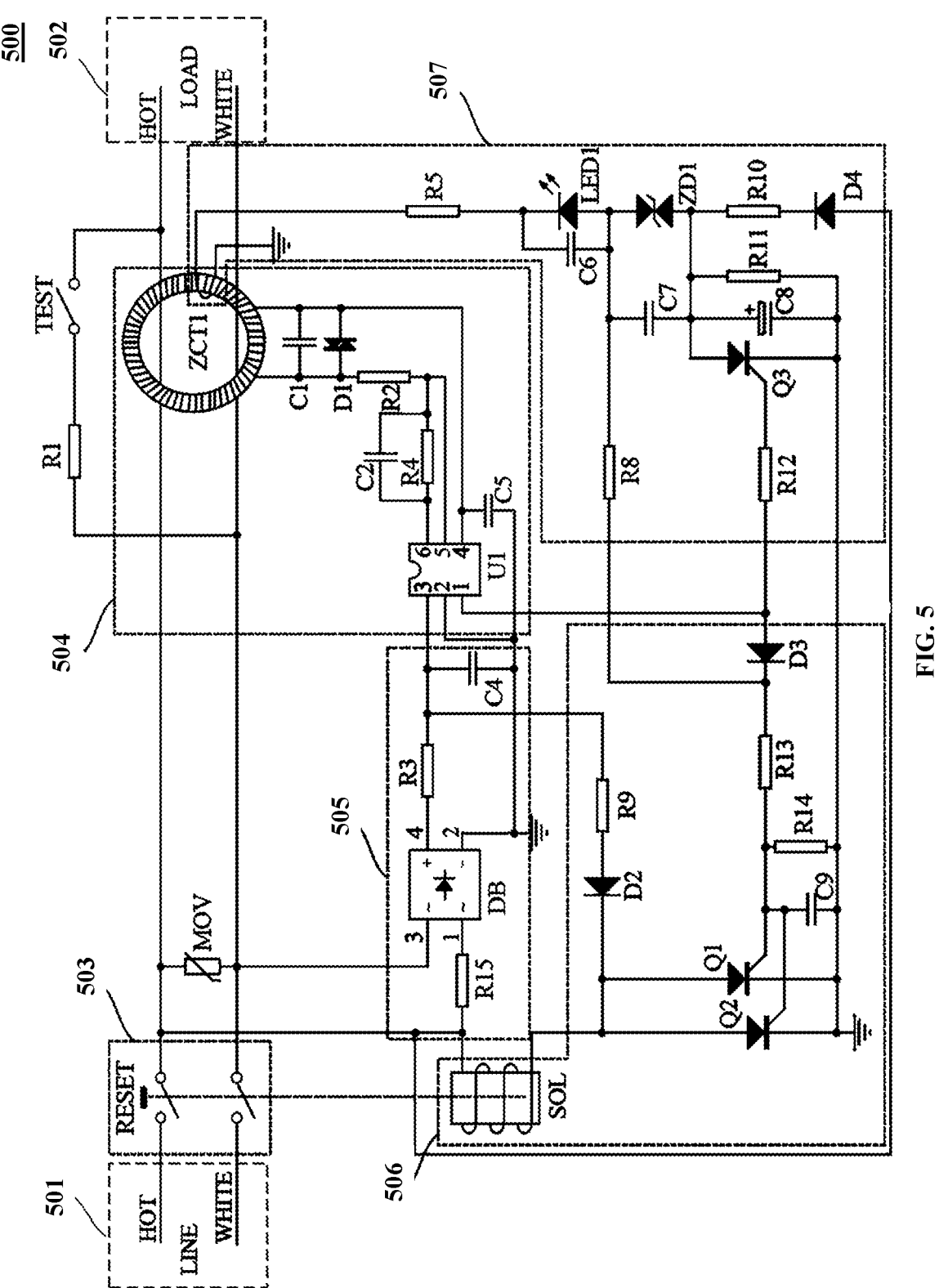
FIG. 5 is a circuit diagram of a leakage current detection and interruption device according to a third embodiment of the present invention based on the block diagram of FIG. 1.

FIG. 5 shows a third exemplary circuit diagram 500 of the leakage current detection and interruption device 100 of FIG. 1 according to the present invention. The circuit 500 includes a switch module 503, a leakage detection module 504, a power supply module 505, and a driving module 506. These modules may correspond to corresponding modules of the device 100 of FIG. 1. In addition, the circuit 500 also includes an input terminal 501 and an output terminal 502 of the power line, and a self-test module 507.

Except for the power module 505, other modules of the circuit 500 have the same or similar circuits and functions as the corresponding modules of the circuit 300, and their working principles will not be described in detail. The power module 505 of FIG. 5 is similar to the power module 305 of FIG. 3, except that the capacitor C3 is replaced by a resistor R15 as the first current limiting element, and the first end of the resistor R15 is directly coupled to the power line, and the second end of the resistor R15 is coupled to the input of rectifier DB (e.g. pin 1). For example, resistor R15 has a relatively high resistance value to reduce the overall operating power consumption of circuit 500.

It should be understood that although the above circuits 300 to 500 show the use of capacitors or resistors as the first current limiting element, the first current limiting element includes but is not limited to resistors, capacitors, inductors, or various combinations thereof. In addition, although the above circuits 300 to 500 show the first diode and/or the second current limiting element outside the power module, the first diode and/or the second current limiting element may be integrated into the power module. For example, the first diode can be integrated within the rectifier.

Figure 2:
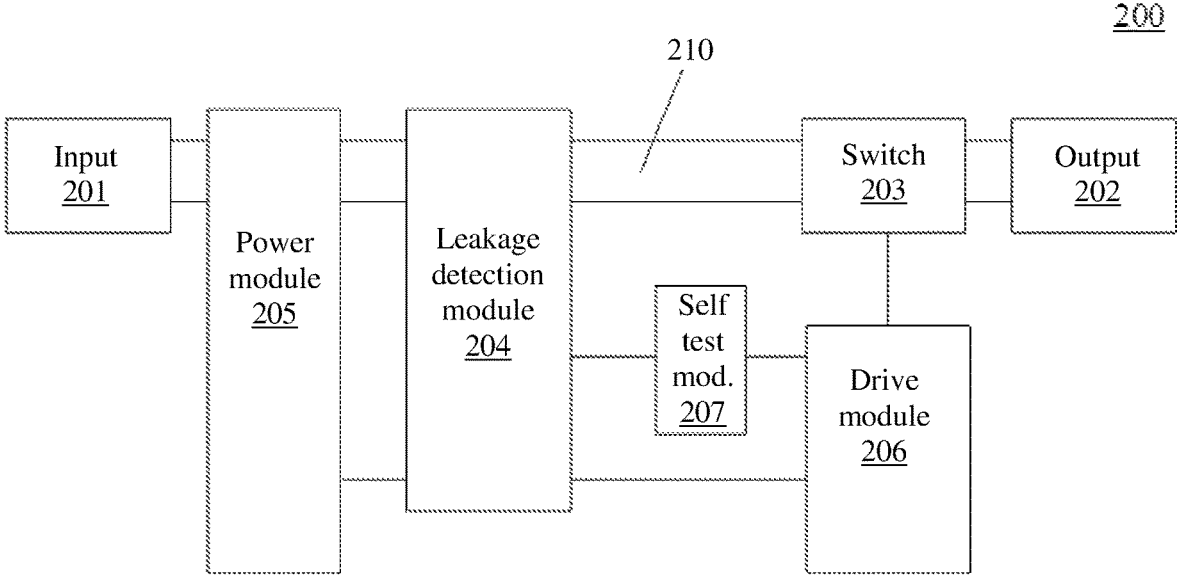
FIG. 2 is a block diagram illustrating a leakage current detection and interruption device according to other embodiments of the present invention.

FIG. 2 is a block diagram illustrating a leakage current detection and interruption device 200 according to other embodiments of the present invention.

As shown in FIG. 2, the leakage current detection and interruption device 200 includes a power line 210 with an input end 201 and an output end 202, a switch module 203, a leakage detection module 204, a power supply module 205, a driving module 206, and a self-test module 207. The switch module 203 is coupled between the input terminal 201 and the output terminal 202 to control the power connection therebetween. The power line (also referred to as current carrying lines or power supply lines) connects the input terminal 201 and the output terminal 202. The output terminal 202 is coupled to a load (LOAD), such as an electrical appliance or a power strip. When the load uses power, a current loop is formed between the first current-carrying line and the second current-carrying line. The leakage detection module 204 is coupled between the input terminal 201 and the output terminal 202, and is configured to detect whether there a leakage current is present on the power line, and to generate a leakage fault signal when a leakage current is detected. The driving module 206 is coupled to the leakage detection module 204 and the switch module 203, and drives the switch module 203 to disconnect the power connection between the input terminal 201 and the output terminal 202 in response to the leakage fault signal from the leakage detection module 204. When the input end 201 of the power line 210 is powered off, the switch module 203 maintains the original connected state. The power module 205 is configured to supply power to the power supply end of the leakage detection module 204. The power module 205 includes at least a capacitor, which is coupled in series between the power line 210 and the leakage detection module 204 to reduce the overall operating power consumption of the device 200. The self-test module 207 is coupled to the leakage detection module 204 and the driving module 206. The self-test module 207 is configured to generate a self-test signal (for example, a simulated leakage current), and to generate a self-test fault signal when the leakage detection module 204 and/or the driving module 206 has a fault so that faults in the leakage current detection and interruption device 200 can be discovered timely and replaced.

Different from the leakage current detection and interruption device 100, the power module 205 of the leakage current detection and interruption device 200 does not feed a signal to the driving module 206, so that when a leakage fault with pulsating DC characteristics occurs, the driving module 206 cannot drive the switch module 203 in the full cycle. Therefore, the leakage protection device 200 has a leakage detection capability for leakage current with AC characteristics but does not have the leakage detection capability for leakage current with pulsating DC characteristics. In other words, except that there is no control between the power module 205 and the driving module 206, the modules of the leakage current detection and interruption device 200 and the corresponding modules of the leakage current detection and interruption device 100 have the same or similar functions.

Compared to existing leakage protection devices (for example, with power consumption generally around 0.3 w), the leakage protection device 200 in FIG. 2 can effectively reduce operating power consumption (for example, with ultra-low power consumption less than or equal to 0.1 w) to meet requirements of environmental conservation, has leakage detection capabilities for leakage current having AC characteristics, and provides a self-test function to test whether the functions of the leakage detection module and driving module are normal.

Various exemplary circuits of the leakage current detection and interruption device 200 are described below with reference to FIGS. 6 and 7.

Figure 6:
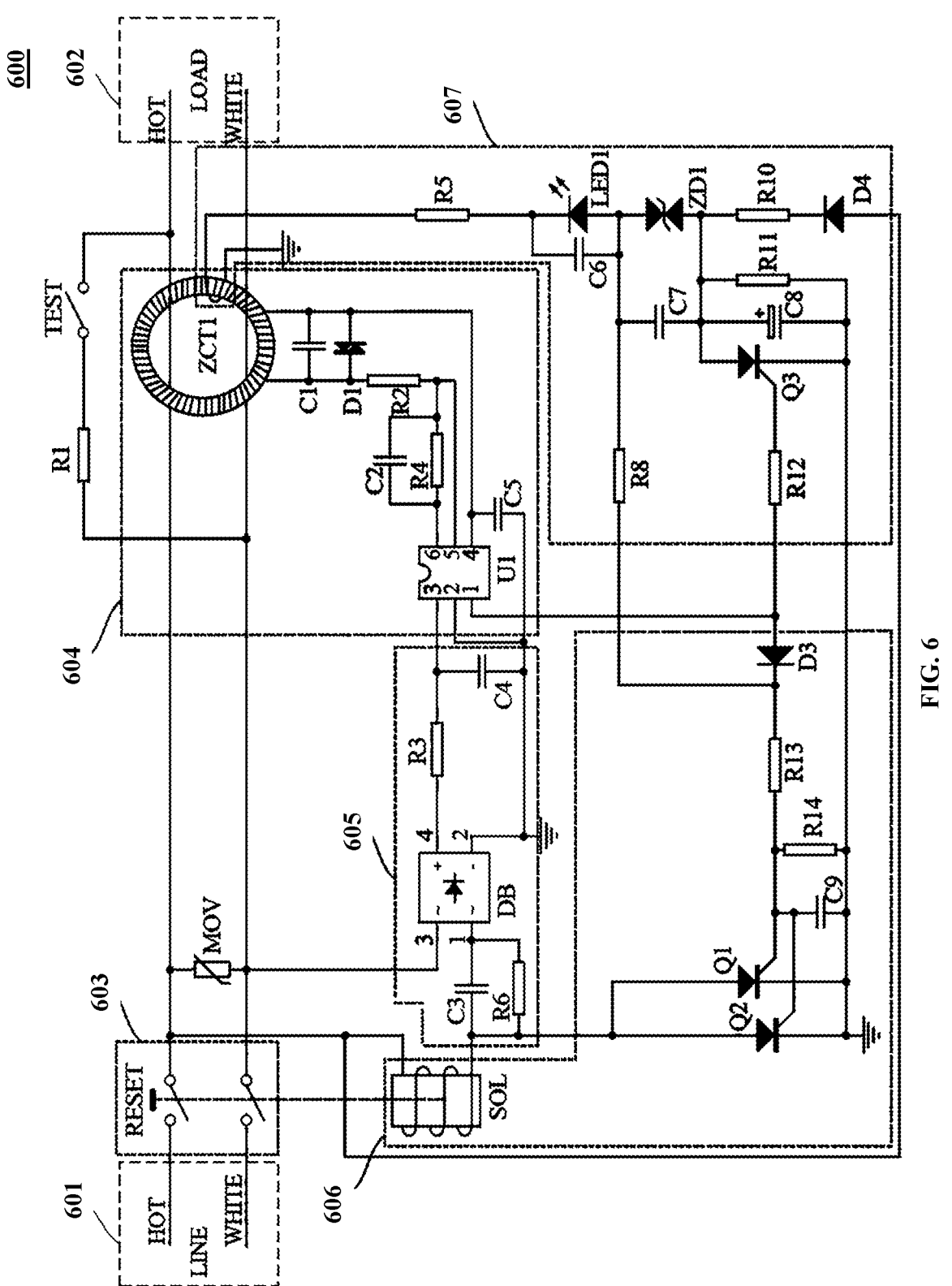
FIG. 6 is a circuit diagram of a leakage current detection and interruption device according to a fourth embodiment of the present invention based on the block diagram of FIG. 2.

FIG. 6 shows a fourth exemplary circuit 600 of the leakage current detection and interruption device 200 of FIG. 2 in accordance with the present invention. The circuit 600 includes a switch module 603, a leakage detection module 604, a power module 605, a driving module 606, and a self-test module 607. These modules may correspond to corresponding modules of the device 200 of FIG. 2. In addition, the circuit 600 also includes an input terminal 601 and an output terminal 602 of the power line.

The circuit 600 is mostly the same as the circuit 300, and the working principles of similar modules will not be described in detail, except that the first diode D2 and the second current limiting element R9 are eliminated in the circuit 600. When a leakage current fault is detected, if the voltage of the power line HOT is lower than that of the power line WHITE, the switching semiconductor device Q1/Q2 does not have the ability to maintain conduction (refer to discussion above in conjunction with circuits 300-500). The device only has tripping capability when the voltage of the power line HOT is higher than that of the power line WHITE. Therefore, the device only has leakage current detection capability for leakage current with AC characteristics but not for leakage current with pulsating DC characteristics.

Figure 7:
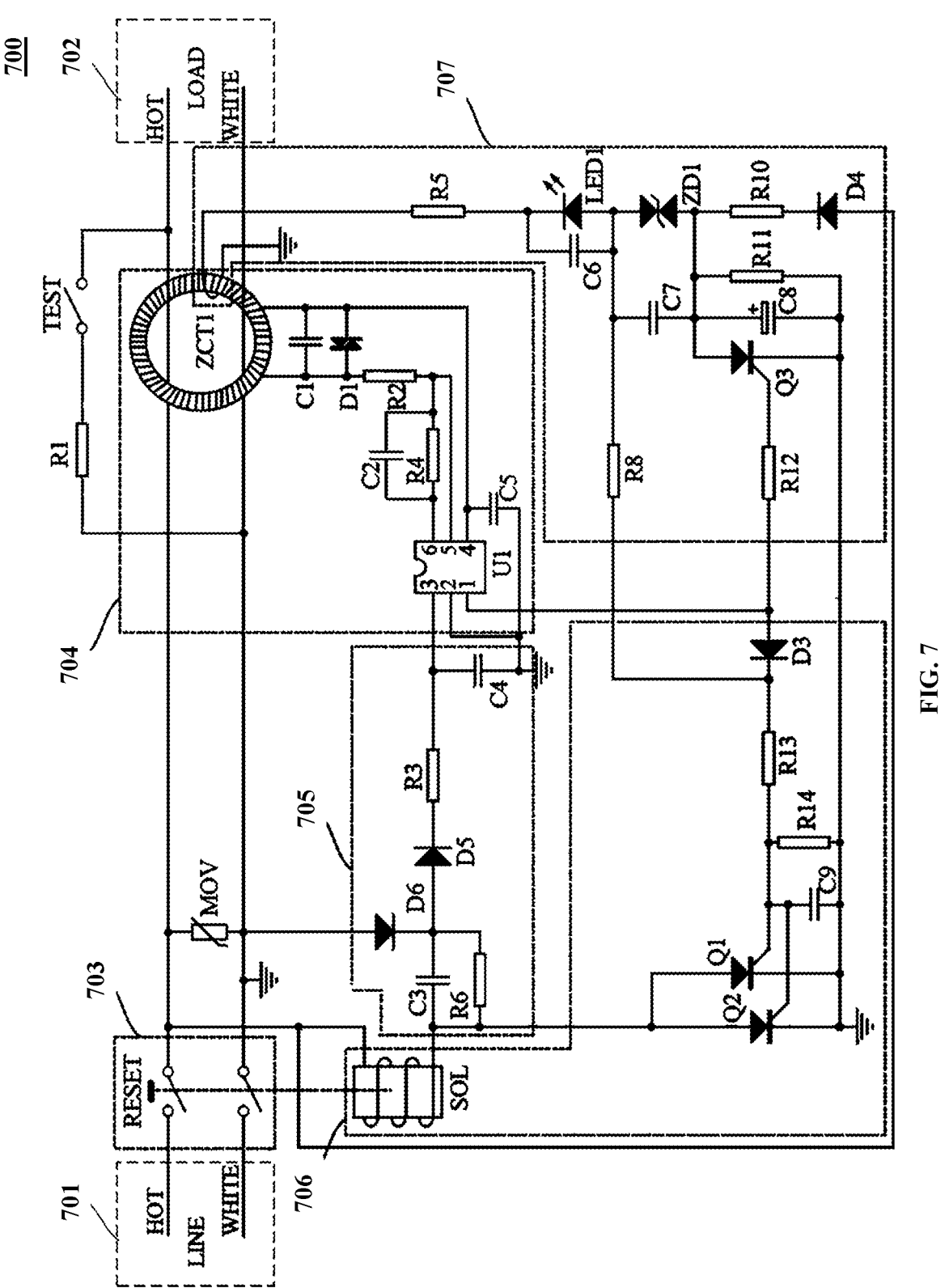
FIG. 7 is a circuit diagram of a leakage current detection and interruption device according to a fifth embodiment of the present invention based on the block diagram of FIG. 2.

FIG. 7 shows a fifth exemplary circuit 700 of the leakage current detection and interruption device 200 of FIG. 2 according to the present invention. The circuit 700 includes a switch module 703, a leakage detection module 704, a power module 705, a driving module 706, and a self-test module 707. These modules may correspond to corresponding modules of the device 200 of FIG. 2. In addition, the circuit 700 also includes an input terminal 701 and an output terminal 702 of the power line.

The circuit 700 is mostly the same as the circuit 400, and the working principles of similar modules will not be described in detail, except that the first diode D2 and the second current limiting element R9 in the circuit 400 are eliminated. When a leakage current fault is detected, if the voltage of the power line HOT is lower than the power line WHITE, and the switching semiconductor device Q1/Q2 does not have the ability to maintain conduction (refer to discussion above in conjunction with circuits 300-500). The device only has tripping capability when the voltage of the power line HOT is higher than that of the power line WHITE. Therefore, the device only has leakage current detection capability for leakage current with AC characteristics but not for leakage current with pulsating DC characteristics.

Some additional embodiments of the present invention provide an electrical power connection device, which includes a body and a leakage current detection and interruption device according to any one of the above embodiments disposed inside the body.

Other additional embodiments of the present invention provide an electrical appliance, which includes an electrical load, and an electrical power connection device coupled between a power supply and the load to supply power to the load, where the electrical power connection device employs a leakage current detection and interruption device according to any one of the above embodiments.

While the present invention is described above using specific examples, these examples are only illustrative and do not limit the scope of the invention. It will be apparent to those skilled in the art that various modifications, additions and deletions can be made to the leakage current protection device of the present invention without departing from the spirit or scope of the invention.

The invention claimed is:

1. A leakage current detection and interruption device comprising:

a power line having an input end and an output end;

a switch module, configured to control a power connection between the input and output ends of the power line;

a leakage detection module configured to detect a leakage current on the power line and to generate a leakage fault signal when the leakage current exceeds a predefined threshold;

a power module, configured to supply power to a power input end of the leakage detection module, the power module including at least one first current limiting element coupled in series between the power line and the leakage detection module; and a driving module, configured to drive the switching module to disconnect the power connection in response to the leakage fault signal, the driving module including at least one first electromagnetic coil and at least one first switching semiconductor device, wherein a current flows through the at least one first electromagnetic coil when the at least one first switching semiconductor device is conductive, and wherein a first end of the first electromagnetic coil is coupled to the power line, a second end of the first electromagnetic coil is coupled to a first end of the first switching semiconductor device, a first end of the first current limiting element is coupled to the power line, and a second end of the first current limiting element is coupled to the first end of the first switching semiconductor device via at least one first diode or at least one second current limiting element or both.

2. The device of claim 1, further comprising:

a self-test module, coupled to the leakage detection module and the driving module, configured to generate a self-test signal and to generate a self-test fault signal when the leakage detection module or the driving module has a fault or both have faults.

3. The device of claim 2, wherein when the leakage detection module has a fault and the driving module is normal, the self-test module generates a self-test processing signal; and wherein the driving module drives the switching module to disconnect the power connection in response to the self-test processing signal.

4. The device of claim 1, wherein when the input end of the power line is powered off, the switch module maintains its original connected state.

5. The device of claim 1, wherein the first current limiting element includes a resistor, or a capacitor, or a combination thereof.

6. An electrical power connection device, comprising:

a body; and a leakage current detection and interruption device of claim 1, disposed inside the body.

7. An electrical appliance, comprising:

an electrical load; and an electrical power connection device coupled between a power supply and the electrical load, configured to supply power to the electrical load, wherein the electrical power connection device includes a leakage current detection and interruption device of claim 1.

8. A leakage current detection and interruption device comprising:

a power line having an input end and an output end;

a switch module, configured to control a power connection between the input and output ends of the power line;

a leakage detection module configured to detect a leakage current on the power line and to generate a leakage fault signal when the leakage current exceeds a predefined threshold, the leakage detection module including at least one leakage detection chip;

a power module, configured to supply power to a power input end of the leakage detection module, the power module including at least one first capacitor coupled in series between the power line and the leakage detection module and configured to supply a power to the leakage detection chip;

a driving module, configured to drive the switching module to disconnect the power connection in response to the leakage fault signal, the driving module including at least one first electromagnetic coil and at least one first switching semiconductor device; and a self-test module, coupled to the leakage detection module and the driving module, configured to generate a self-test signal and to generate a self-test fault signal when the leakage detection module or the driving module has a fault or both have faults.

9. The device of claim 8, wherein when the leakage detection module has a fault and the driving module is normal, the self-test module generates a self-test processing signal; and wherein the driving module drives the switching module to disconnect the power connection in response to the self-test processing signal.

10. The device of claim 8, wherein when the input end of the power line is powered off, the switch module maintains its original connected state.

11. An electrical power connection device, comprising:

a body; and a leakage current detection and interruption device of claim 8, disposed inside the body.

12. An electrical appliance, comprising:

an electrical load; and an electrical power connection device coupled between a power supply and the electrical load, configured to supply power to the electrical load, wherein the electrical power connection device includes a leakage current detection and interruption device of claim 8.

\* \* \* \* \*